US006623314B1

(12) United States Patent
Cox et al.

(10) Patent No.: US 6,623,314 B1
(45) Date of Patent: Sep. 23, 2003

(54) KELVIN CLAMP FOR ELECTRICALLY COUPLING TO A BATTERY CONTACT

(75) Inventors: Daniel C. Cox, Batavia, IL (US); Kevin I. Bertness, Batavia, IL (US); Jamey L. Butteris, Woodridge, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/207,495

(22) Filed: Jul. 29, 2002

(51) Int. Cl.$^7$ ................................ H01R 4/48
(52) U.S. Cl. .................. 439/759; 439/504; 439/829
(58) Field of Search ...................... 439/754, 759, 439/504, 829, 822

(56) References Cited

U.S. PATENT DOCUMENTS

| | | | | |
|---|---|---|---|---|
| 2,000,665 A | * | 5/1935 | Neal | 439/440 |
| 4,620,767 A | * | 11/1986 | Woolf | 439/217 |
| 4,934,957 A | * | 6/1990 | Bellusci | 439/504 |
| 5,772,468 A | * | 6/1998 | Kowalski et al. | 439/506 |
| 6,140,797 A | | 10/2000 | Dunn | 320/105 |
| 6,238,253 B1 | * | 5/2001 | Qualls | 439/759 |

OTHER PUBLICATIONS

"Alligator Clips with Wire Penetrators" *J.S. Popper, Inc.* product information, downloaded from http://www.jspopper.com/, undated.

* cited by examiner

Primary Examiner—Tho D. Ta
(74) Attorney, Agent, or Firm—Westman, Champlin & Kelly

(57) ABSTRACT

A Kelvin clamp for coupling a first electrical conductor and a second electrical conductor to a battery contact to provide a Kelvin connection to the battery contact. The Kelvin clamp includes a first electrically conductive arm having a first grasping portion that can couple to the battery contact and to the first electrical conductor. Also included is a second arm that has a first electrically conductive piece and a second electrically conductive piece, which are mechanically coupled together and electrically isolated from each other. The first electrically conductive piece has a second grasping portion that can couple to the battery contact. The first electrically conductive piece can also couple to the second electrical conductor. The first electrically conductive arm and the second electrically conductive piece are electrically and mechanically coupled together by a spring mechanism.

23 Claims, 6 Drawing Sheets

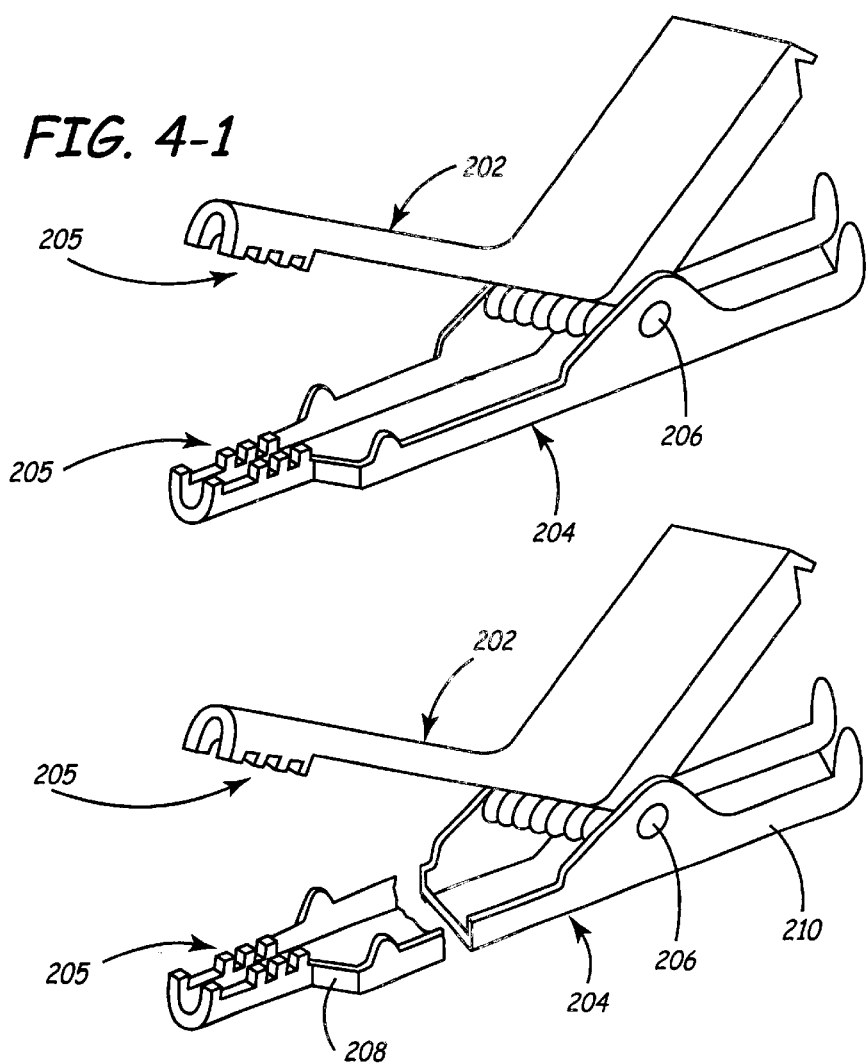
FIG. 4-1
FIG. 4-2
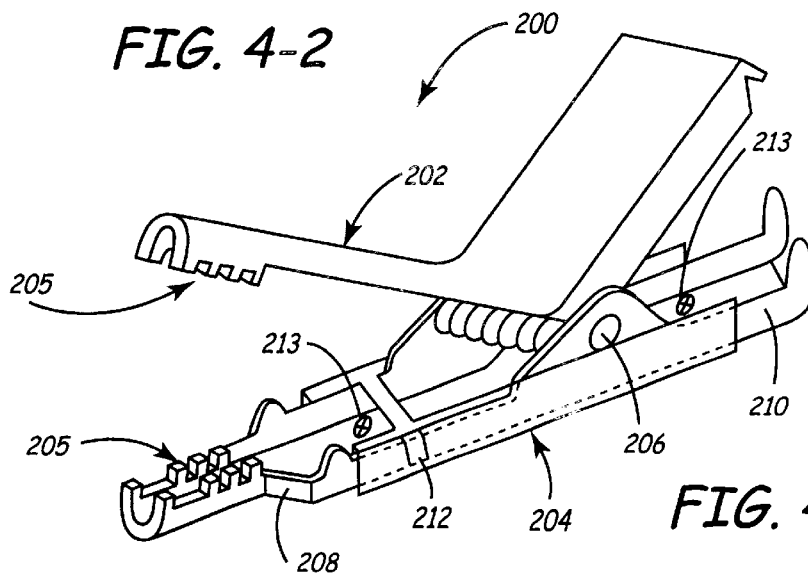
FIG. 4-3

KELVIN CLAMP FOR ELECTRICALLY COUPLING TO A BATTERY CONTACT

BACKGROUND OF THE INVENTION

The present invention generally relates to storage batteries. More specifically, the present invention relates to a Kelvin clamp for electrically coupling to storage batteries.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically, each cell has a voltage potential of about 2.1 volts. By connecting the cells in series, the voltage of the individual cells are added in a cumulative manner. For example, in a typical automotive storage battery, six storage cells are used to provide a total voltage when the battery is fully charged up to 12.6 volts.

Several techniques have been used to test the condition of storage batteries. These techniques include a voltage test to determine if the battery voltage is below a certain threshold, and a load test that involves discharging a battery using a known load. A more recent technique involves measuring the conductance of the storage batteries. This technique typically involves the use of Kelvin connections for testing equipment. A Kelvin connection is a four point connection technique that allows current to be injected into a battery through a first pair of connectors attached to the battery contacts, while a second pair of connectors is attached to the battery contacts in order to measure the voltage across the posts. Various types of clamps have been designed to couple to the battery terminals and to continue the circuit that includes the Kelvin connection. However, these prior art clamps are complex and costly.

SUMMARY OF THE INVENTION

A Kelvin clamp for coupling a first electrical conductor and a second electrical conductor to a battery contact to provide a Kelvin connection to the battery contact is provided. The Kelvin clamp includes a first electrically conductive arm having a first grasping portion that can couple to the battery contact and to the first electrical conductor. Also included is a second arm that has a first electrically conductive piece and a second electrically conductive piece, which are mechanically coupled together and electrically isolated from each other. The first electrically conductive piece has a second grasping portion that can couple to the battery contact. The first electrically conductive piece can also couple to the second electrical conductor. The first electrically conductive arm and the second electrically conductive piece are electrically and mechanically coupled together by a spring mechanism.

BRIEF DESCRIPTION OF THE DRAWINGS

FIG. 2 illustrates a diagrammatic view of a Kelvin clamp in accordance with an embodiment of the present invention.

FIGS. 3-1 to 3-3 illustrate a method of forming a Kelvin clamp in accordance with an embodiment of the present invention.

FIGS. 4-1 to 4-3 illustrate a method of forming a Kelvin clamp in accordance with an embodiment of the present invention.

DETAILED DESCRIPTION OF THE PREFERRED EMBODIMENTS

Figure 1:
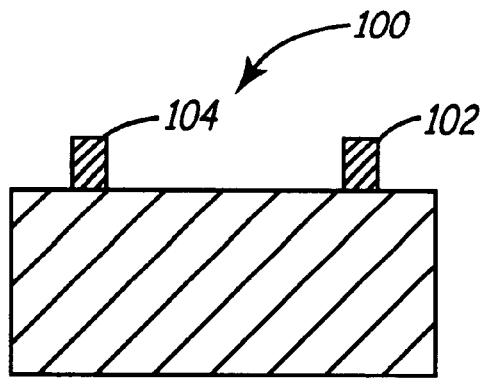
FIGS. 1-1 to 1-3 illustrate cross-sections of prior art battery contacts that the Kelvin clamp of the present invention is capable of grasping.
Figures 1, 2:
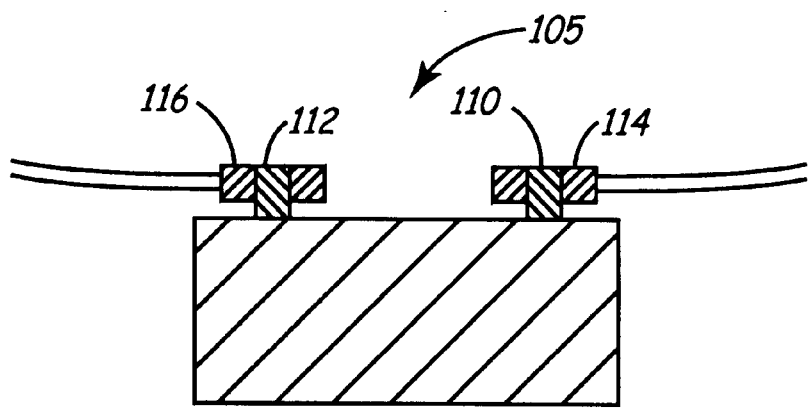
Figures 1, 2, 3:
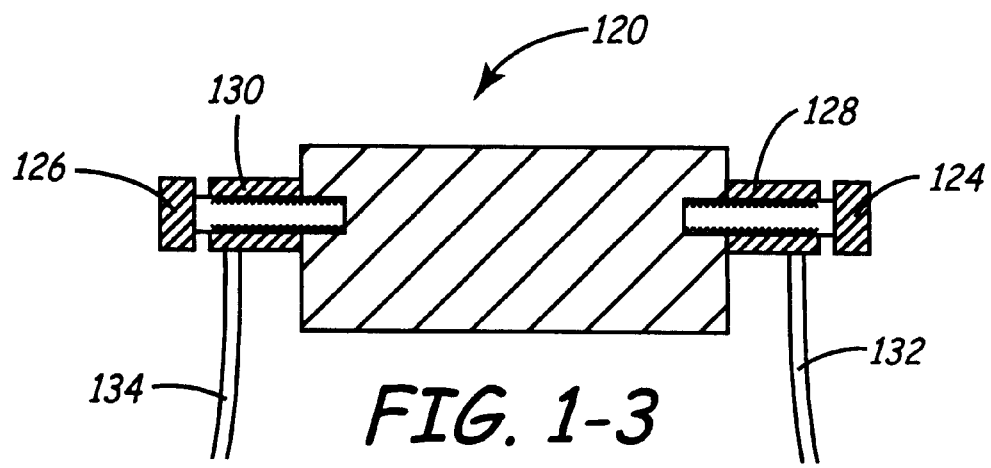
Figure 2:
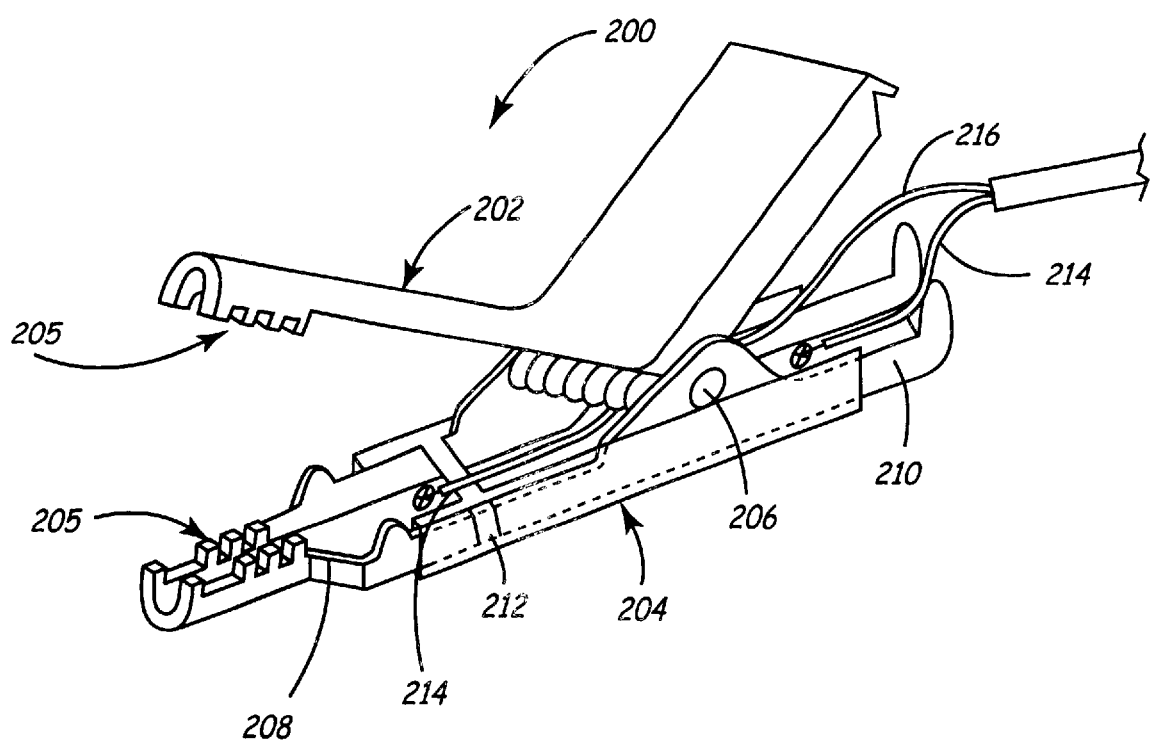
Figures 1, 3:
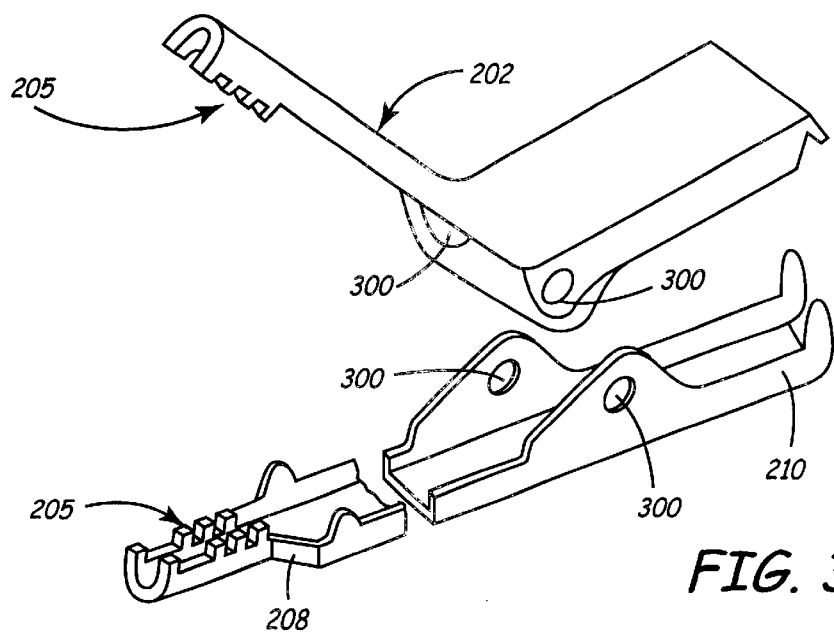
Figures 2, 3:
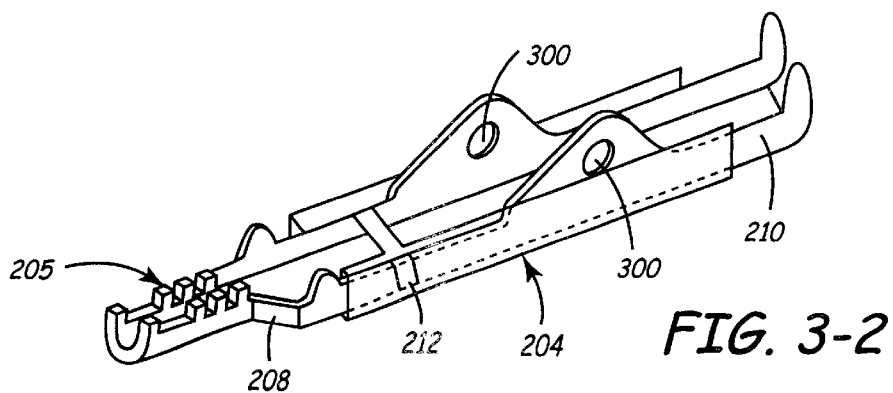
Figure 3:
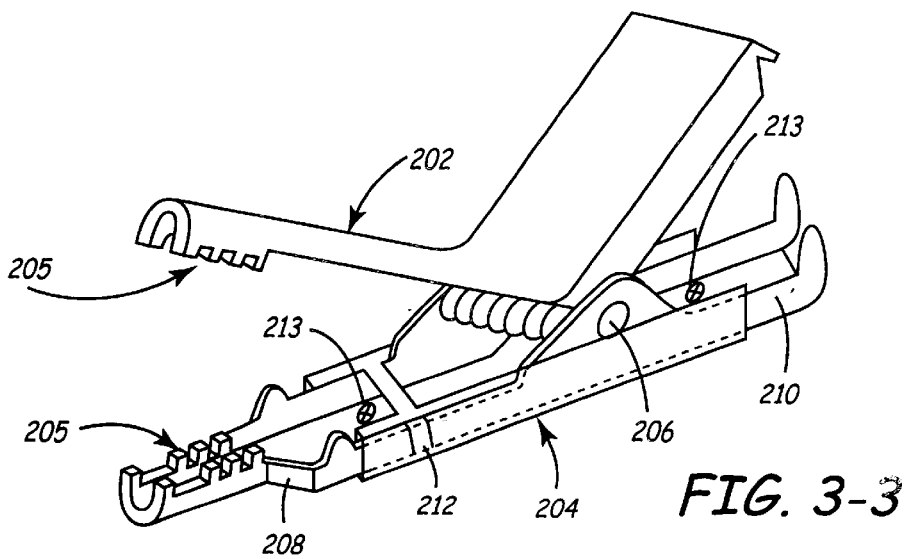

In the discussion below, the term "battery contact" is used to define a portion of the battery onto which the Kelvin clamp of the present invention can be applied. Prior art FIGS. 1-1 to 1-3 illustrate examples of different battery contacts that the Kelvin clamp of the present invention is capable of grasping. In FIG. 1-1, battery contact refers to either terminal 102 or terminal 104 of battery 100. FIG. 1-2 shows battery 105 connected with clamps that connect to an external circuit (not shown). Here the term battery contact refers to a battery terminal with an attached clamp. Thus, either terminal 110 with attached clamp 114 or terminal 112 with attached clamp 116 qualifies as a battery contact to which the Kelvin clamp of the present invention can be applied. Similarly, FIG. 1-3 shows battery 120 with clamps that grip bolts (terminals) connected to sides of battery 120 and connect to an external circuit (not shown). Here either bolt 124 with attached clamp 128 or bolt 126 with attached clamp 130 qualifies as a battery contact. The term battery contact is not restricted in application to the illustrative examples of FIGS. 1-1 to 1-3.

FIG. 2 shows a Kelvin clamp 200 in accordance with an embodiment of the present invention. The same reference numerals are used in the various figures to represent the same or similar elements. Kelvin clamp 200 is designed to electrically couple electrical conductors, such as 214 and 216, of a Kelvin connection, to a battery contact (not shown in FIG. 2).

As can be seen in FIG. 2, Kelvin clamp 200 includes a first electrically conductive arm 202 and a second arm 204 that are pivotally connected together. Arms 202 and 204 each include grasping portions 205, which are capable of grasping a battery contact. Second arm 204 includes a first electrically conductive piece 208 and a second electrically conductive piece 210. Electrically conductive pieces 208 and 210 are mechanically coupled together and electrically isolated from each other by insulator 212. First arm 202 is connected to second piece 210 of second arm 204 by pivot 206, such that first arm 202 and second piece 210 of second arm 204 are both electrically and mechanically coupled together to form a first electrically conductive portion of Kelvin clamp 200. Conductive piece 208 forms a second electrically conductive portion of Kelvin clamp 200. First electrical conductor 214 of a Kelvin connection is electrically coupled to the first electrically conductive portion formed by arm 202 and conductive piece 210 and second electrical conductor 216 of the Kelvin connection is electrically coupled to conductive piece 208 of second arm 204. In embodiments of the present invention, electrical conductors 214 and 216 are soldered to the respective electrically conductive portions of clamp 200. In some embodiments of the present invention, electrical conductor 214 is one of a pair of Kelvin connectors that measures voltage across the battery contacts, and electrical conductor 216 is one of a pair of Kelvin connectors that injects current into the battery through the battery contacts. Conductor 216, which is connected to conductive piece 208, is preferably employed to inject current since conductive piece 208 is relatively small, and therefore, does not substantially add to the resistance of the current path. In this configuration, greater accuracy in measurements can be obtained.

In general, electrically conductive arm 202 and electrically conductive pieces 208 and 210 may be formed of an electrically conductive material such as copper. In some embodiments, insulating grips (not shown) are provided on each arm (202, 204) for user protection. FIG. 2 shows one example embodiment of a Kelvin clamp 200 in accordance with the present invention. However, any Kelvin clamp with a first electrically conductive arm and a second arm separated into first and second electrically conductive pieces which are mechanically coupled together and electrically isolated from each other, is within the scope of the present invention.

FIGS. 3-1 to 3-3 collectively illustrate a method of forming a Kelvin clamp in accordance with an embodiment of the present invention. The method includes providing a first electrically conductive arm 202 and first and second electrically conductive pieces 208 and 210, which are illustrated in FIG. 3-1. Conductive pieces 208 and 210 may be formed by separating a single conductive piece of an arm of a clip. Arm 202 and conductive piece 210 include groove 300, which are substantially similar in size. Arm 202 and conductive piece 208 include substantially similar grasping portions 205. First and second electrically conductive pieces 208 and 210 are coupled together by insulator 212 to form a second arm 204 as shown in FIG. 3-2. In some embodiments, insulator 212 may be formed around pieces 208 and 210. In other embodiments, insulator 212 may be molded into a suitable shape, and conductive pieces 208 and 210 may be attached to insulator 212 with rivets or screws, such as 213. First arm 202 and second arm 204 are then pivotally connected together through grooves 300 with the help of a spring mechanism 302 that can include a leaf spring and a bolt extending through grooves 300 to form Kelvin clamp 200 of the present invention as shown in FIG. 3-3. The leaf spring urges grasping portions 205 of arms 202 and 204 together. Kelvin electrical conductors, such as 214 and 216 (shown in FIG. 2) are soldered to conductive pieces 208 and 210.

FIGS. 4-1 to 4-3 collectively illustrate a method of forming a Kelvin clamp in accordance with another embodiment of the present invention. This method embodiment includes providing a clip, shown in FIG. 4-1, having a first electrically conductive arm 202 and a second electrically conductive arm 204. Arms 202 and 204 are pivotally connected together and include grasping portions 205. Second conductive arm 204 is separated into a first electrically conductive piece 208 and a second electrically conductive piece 210 using any suitable tool capable of cutting metal. The clip with separated arm 204 is shown in FIG. 4-2. First and second electrically conductive pieces 208 and 210 are then coupled together by insulator 212 to form Kelvin clamp 200 of the present invention (FIG. 4-3). Coupling of pieces 208 and 210 with insulation 212 is carried out as described above in connection with FIG. 3-2.

Embodiments of the present invention, described above, are particularly useful with equipment for testing and charging storage batteries. Battery testers and chargers employing Kelvin clamps in accordance with the present invention are described below in connection with FIGS. 5 and 6.

Figure 5:
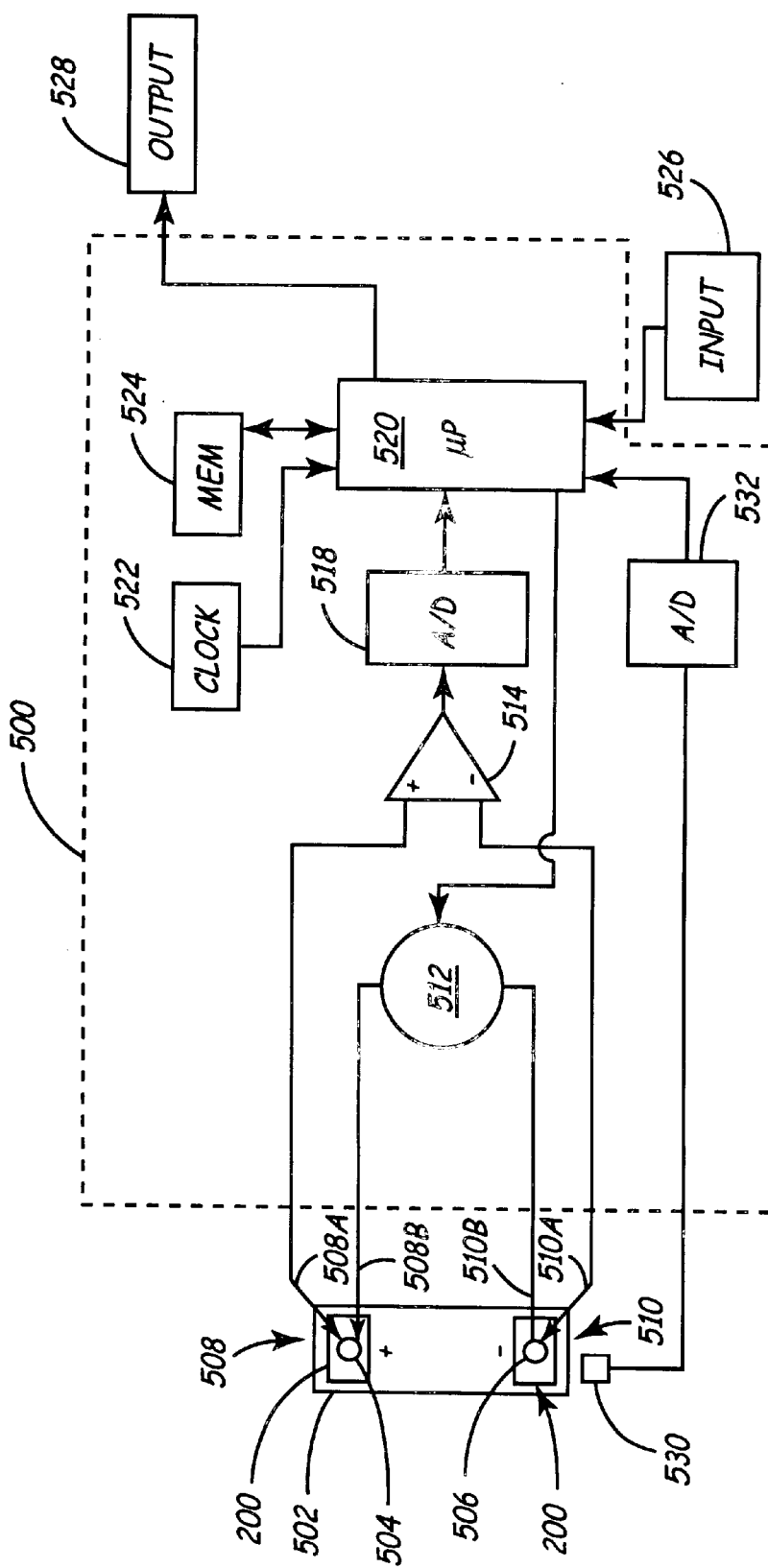
FIG. 5 is a simplified block diagram of a battery tester with which the present invention is useful.

FIG. 5 is a simplified block diagram of electronic battery tester circuitry 500 with which the present invention is useful. A four point (or Kelvin connection) technique is used to couple system 500 to battery 502. Kelvin connections 508 and 510 are used to couple, to battery contacts 504 and 506, respectively, of battery 502. Kelvin connection 508 includes two individual connections 508A and 508B. Similarly, Kelvin connection 510 includes two individual connections, 510A and 510B. Kelvin clamps 200 of the present invention grasp battery contacts 504 and 506 and couple them to electrical connections 508, 510.

Circuitry 500 includes a current source 512 and a differential amplifier 514. Current source 512 is coupled to connections 508B and 510B of Kelvin connections 508 and 510, respectively. Differential amplifier 514 is coupled to connection 508A and connection 510A of Kelvin connections 508 and 510, respectively. An output from differential amplifier 514 is provided to analog to digital converter 518 which itself provides a digitized output to microprocessor 520. Microprocessor 520 is connected to a system clock 522, a memory 524, and analog to digital converter 518. Microprocessor 520 is also capable of receiving an input from an input device 526 and providing an output of output device 528. The input can be, for example, a rating for the battery 502. Input device 526 can comprise any or multiple types of input devices. The result of a battery test, either qualitative or quantitative, can be an output device 528. Device 528 can be a display or other output. The invention can operate with any technique for determining a voltage across battery 502 and a current through battery 502 and is not limited to the specific techniques set forth herein. The forcing function source or current source 512 can provide any signal having a time varying component, including a stepped pulse or a periodic signal, having any shape, applied to battery 502. The current source can be an active source in which the current source signal is injected into battery 502, or can be a passive source, such as a load, which is switched on under the control of microprocessor 520.

In operation, microprocessor 520 can receive an input through input 526, such as a rating for battery 502. Microprocessor 520 determines a dynamic parameter, such as dynamic conductance, of battery 502 as a function of sensed voltage and current. The change in these sensed values is used to determine the dynamic parameter. For example, the dynamic conductance ($\Delta G$) is determined as:

$$\Delta G = \Delta I / \Delta V \qquad \text{EQ. 1}$$

where $\Delta I$ is the change in current flowing through battery 502 due to current source 512 and $\Delta V$ is the change in battery voltage due to applied current $\Delta I$. A temperature sensor 530 can be thermally coupled to battery 502 and used to compensate battery measurements. Temperature readings can be stored in memory 524 for later retrieval.

Figure 6:
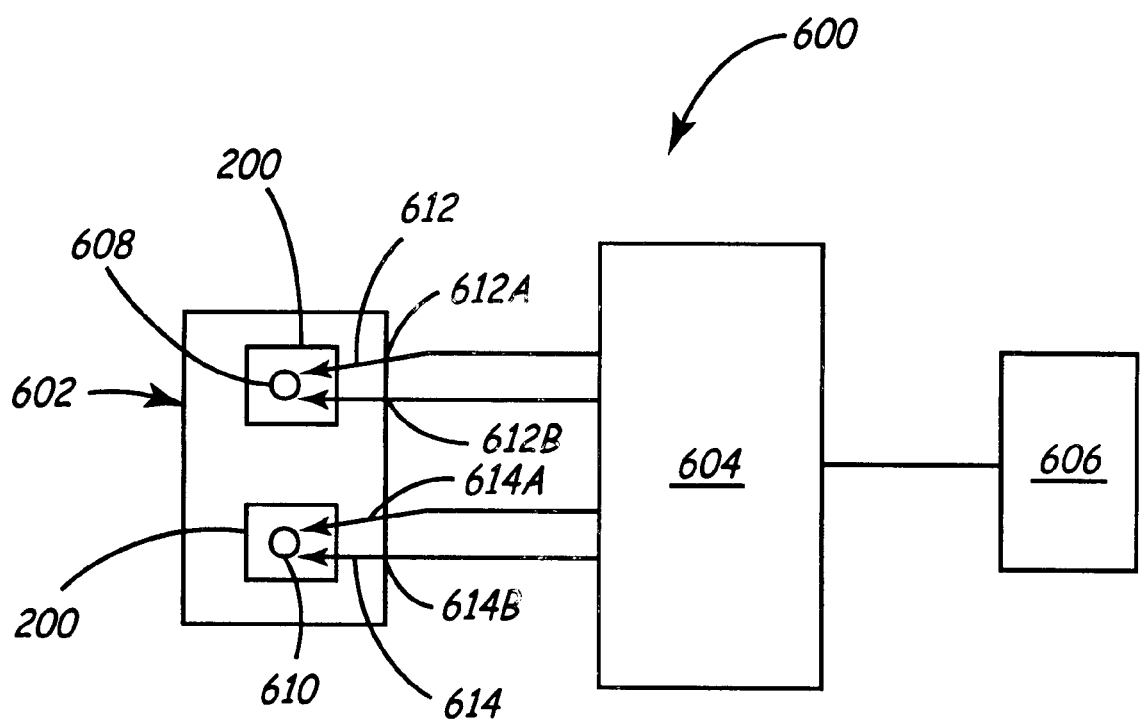
FIG. 6 is a simplified block diagram of a battery charger with which the present invention is useful.

FIG. 6 is a simplified block diagram of a battery charging system 600 using the present invention. System 600 is shown coupled to battery 602. System 600 includes battery charging and testing circuitry 604 and microprocessor 606. System 600 couples to battery contacts 608 and 610 through Kelvin electrical connections 612 and 614 respectively. Electrical connection 612 includes a first connection 612A and second connection 612B and connection 614 includes a first connection 614A and a second connection 614B. Kelvin clamps 200 of the present invention provide coupling between battery contacts 608 and 610 and electrical connections 612 and 614. Battery charger 600 operates in a manner similar to the battery charger set forth in U.S. Pat. No. 6,104,167, issued Aug. 15, 2000, and entitled "METHOD AND APPARATUS FOR CHARGING A BATTERY", which is incorporated herein by reference.

Although the present invention has been described with reference to preferred embodiments, workers skilled in the art will recognize that changes may be made in form and detail without departing from the spirit and scope of the invention. Although the Kelvin clamp of the present invention has been described for use with storage batteries and for coupling battery charging and testing equipment to storage batteries, the invention can be employed in any system where Kelvin electrical connections and Kelvin clamps are utilized.

What is claimed is:

1. A Kelvin clamp for coupling a first electrical conductor and a second electrical conductor to a battery contact of a storage battery to thereby provide a Kelvin connection to the battery contact through the first and second electrical conductors, the Kelvin clamp comprising:

a first electrically conductive arm having a first grasping portion configured to couple to the battery contact, the first electrically conductive arm further configured to couple to the first electrical conductor;

a second arm including a first electrically conductive piece and a second electrically conductive piece with the first electrically conductive piece and the second electrically conductive piece mechanically coupled together and electrically isolated from each other, the first electrically conductive piece of the second arm having a second grasping portion configured to couple to the battery contact and generally aligned with the first grasping portion, the first electrically conductive piece of the second arm further configured to couple to the second electrical conductor; and wherein the first electrically conductive arm and the second electrically conductive piece of the second arm are electrically and mechanically coupled together by a spring mechanism, such that the first grasping portion and the second grasping portion are urged together.

2. The Kelvin clamp of claim 1 wherein the first electrically conductive arm and the second electrically conductive piece of the second arm are pivotally connected together.

3. The Kelvin claim of claim 1 wherein the first electrically conductive piece and the second electrically conductive piece are coupled to the insulator with rivets.

4. The Kelvin clamp of claim 1 wherein the first electrically conductive arm and the first and second electrically conductive pieces of the second arm comprise copper.

5. The Kelvin clamp of claim 1 wherein the insulator comprises plastic.

6. The Kelvin clamp of claim 1 wherein the insulator comprises a composite material.

7. A battery tester including the Kelvin clamp of claim 1.

8. A battery charger including the Kelvin clamp of claim 1.

9. The Kelvin clamp of claim 7 or 8 wherein the first electrical conductor of the Kelvin connection is one of a first pair of Kelvin connectors that measures voltage across battery contacts, and wherein the second electrical conductor of the Kelvin connection is one of a second pair of Kelvin connectors that injects a forcing function into a battery through the battery contacts.

10. A method of forming a Kelvin clamp comprising:

providing a first electrically conductive arm;

connecting a first electrical conductor to the first electrically conductive arm;

providing a first electrically conductive piece having a terminal grasping portion and a coupling portion;

providing a second electrically conductive piece;

linking the coupling portion of the first electrically conductive piece and the second electrically conductive piece mechanically to form a second arm, with the first electrically conductive piece and the second electrically conductive piece electrically isolated from each other;

connecting a second electrical conductor to the first electrically conductive piece;

coupling the first arm and the second electrically conductive piece mechanically and electrically.

11. The method of claim 10 wherein the first electrically conductive arm and the first and second electrically conductive pieces of the second arm comprise copper.

12. A Kelvin clamp formed through the process of claim 10.

13. The method of claim 10 wherein linking the coupling portion of the first electrically conductive piece and the second electrically conductive piece mechanically is carried out with an insulator.

14. The method of claim 13 wherein the insulator comprises plastic.

15. The method of claim 13 wherein the insulator comprises a composite material.

16. A method of forming a Kelvin clamp comprising:

providing a clip having a first electrically conductive arm and a second electrically conductive arm, with the first arm and the second arm electrically and mechanically coupled to each other;

connecting a first electrical conductor to the first electrically conductive arm;

separating the second arm into a first electrically conductive piece and a second electrically conductive piece, with the separation being carried out proximate a terminal grasping portion of the second arm, such that the terminal grasping portion is a part of the first electrically conductive piece, and such that the second electrically conductive piece remains electrically and mechanically coupled to the first arm after being separated from the first electrically conductive piece;

connecting a second electrical conductor to the first electrically conductive piece;

mechanically linking the first electrically conductive piece and the second electrically conductive piece such that the first electrically conductive piece is electrically isolated from the second electrically conductive piece.

17. The method of claim 16 wherein the first electrically conductive arm and the second electrically conductive arm comprise copper.

18. The method of claim 16 wherein mechanically linking the first electrically conductive piece and the second electrically conductive piece is carried out with an insulator.

19. The method of claim 18 wherein the insulator comprises plastic.

20. The method of claim 18 wherein the insulator comprises a composite material.

21. A Kelvin clamp formed through the process of claim 16.

22. A battery tester including the Kelvin clamp of claim 21.

23. A battery charger including the Kelvin clamp of claim 21.

* * * * *